United States Patent [19]
Kodama et al.

[11] Patent Number: 5,519,574
[45] Date of Patent: May 21, 1996

[54] ELECTRONIC COMPONENT COOLING APPARATUS

[75] Inventors: Nobumasa Kodama, Ueda; Toshiki Ogawara, Nagano, both of Japan

[73] Assignee: Sanyo Denki Co., Ltd., Tokyo, Japan

[21] Appl. No.: 305,029

[22] Filed: Sep. 13, 1994

[30] Foreign Application Priority Data

Jan. 20, 1994 [JP] Japan .................................. 6-004496

[51] Int. Cl.$^6$ ...................................................... H05K 7/20
[52] U.S. Cl. ............................ 361/697; 165/80.3; 165/122; 257/718
[58] Field of Search ......................... 165/80.2, 80.3, 165/121, 122, 185; 174/16.3; 257/718–719, 726, 727; 361/688, 694–697, 703, 707, 709–710, 715, 717–718, 722

[56] References Cited

U.S. PATENT DOCUMENTS 5,251,101  10/1993  Liu .......................................... 257/718

*Primary Examiner*—Gregory D. Thompson
*Attorney, Agent, or Firm*—Pearne, Gordon, McCoy & Granger

[57] ABSTRACT

An electronic component cooling apparatus capable of permitting a cooling unit to be assembled separately from a holder mounting member. The holder mounting member is used for mounting an electronic component holder on the cooling unit while keeping an electronic component contacted with a rear surface of a base of a heat sink. The holder mounting member includes a unit engagement segment including an annular member engaged with a flange section of a casing of a motor-driven fan and holder engagement segments each formed at an end thereof with a hole releasably engaged with each of projections provided on the electronic component holder. The casing includes a cylindrical section integrally provided on an outer peripheral surface thereof with projections and the annular member of the holder mounting member is provided on an inner peripheral surface thereof with recesses fittedly engaged with the projections, so that positioning of the holder mounting member and prevention of rotation thereof may be accomplished.

19 Claims, 3 Drawing Sheets

ELECTRONIC COMPONENT COOLING APPARATUS

BACKGROUND OF THE INVENTION

This invention relates to an electronic component cooling apparatus, and more particularly to an apparatus for cooling electronic components incorporated in an electronic appliance such as a microprocessor unit (MPU) or the like.

Recently, a microprocessor unit tends to be increased in integration in order to enhance performance thereof. Unfortunately, this causes generation of heat from the microprocessor unit to be substantially increased, so that it is required to subject the microprocessor unit to forcible cooling. In order to solve the problem, an electronic component cooling apparatus which is called an MPU cooler is provided for forcibly cooling the microprocessor unit.

Now, such an electronic component cooling apparatus which has been conventionally used to this end will be described with reference to FIGS. 3(A) and 3(B).

In FIGS. 3(A) and (B), reference numeral 100 designates a motor-driven fan and 101 is a motor of the rotor out-rotation type wherein a rotor is rotated outside astator. Reference numeral 102 is an impeller provided with a plurality of blades 103 and fixed on the rotor. 104 is a casing arranged so as to surround the impeller 102, 105 is webs for interconnecting a housing 101A of the motor 101 and the casing 104, and 106 is a heat sink provided on one surface of a base 106a thereof with a plurality of radiation fins 107. The radiation fins 107 are arranged so as to be parallel to each other. The motor-driven fan 100 is secured to the heat sink 108 by means of a plurality of screws 108 and cooperates with the heat sink 106 to construct a cooling unit.

Reference numeral 109 designates an electronic component holder for holding a microprocessor unit or MPU 110 which is an electronic component to be cooled, which holder 109 is generally called a socket in the art. 111 is a holder mounting member for mounting the electronic component holder 109 on the cooling unit while contacting the MPU 110 with the other surface of the base 106a of the heat sink 106. 112 is a printed circuit board on which the electronic component holder 109 is mounted. The holder mounting member 111 may be made of a steel bar or wire of, for example, 1.2 mm in diameter by bending. The holder mounting member 111 includes a unit engagement segment 111a provided with an engagement section fittedly arranged between any adjacent two of the radiation fins 107 and engaged with the heat sink 106 and at least two holder engagement segments 111b and 111c provided with engagement sections releasably engaged with two holder-side engaged sections 109a and 109b provided on a pair of end surfaces of the electronic component holder 109 opposite to each other, respectively.

As will be noted from the foregoing, the conventional electronic component cooling apparatus is so constructed that the engagement section of the unit engagement segment 111a of the holder mounting member 111 is engaged with a part of the heat sink 106. Such construction causes securing of the motor-driven fan 100 to the heat sink 106 by means of screws to require to mount the holder mounting member 111 on the cooling unit. Thus, assembling of the cooling apparatus necessarily requires to arrange the holder mounting member 111 between the heat sink 106 and the motor-driven fan 100 in advance. Unfortunately, this, when the cooling apparatus is to be assembled by assembly-line production, causes transportation and storage of the cooling unit to be highly troublesome because the cooling unit is kept mounted with the holder mounting member 111. Also, this exhibits another disadvantage that when any defect is found in the holder mounting member 111 after assembling of the cooling apparatus, it is required to detach the motor-driven fan 100 from the heat sink 106 for replacement of the defective holder mounting member 111, resulting in the replacement being troublesome.

Further, when the holder engagement segments 111b and 111c of the holder engagement member 111 are kept engaged with the holder-side engagement sections 109a and 109b of the electronic component holder 109, the unit engagement segment 111a is caused to be deformed because of being made of a thin steel rod or wire, leading to deterioration in tightness between the heat sink 106 and the electronic component 110.

Moreover, the conventional apparatus is so constructed that engagement between the holder engagement segments 111b and 111c and the holder-side engagement sections 109a and 109b of the electronic component holder 109 is accomplished in a hooked manner by pushing down the holder engagement segments 111b and 111c by fingers, to thereby cause mounting of the electronic component holder to be troublesome.

SUMMARY OF THE INVENTION

The present invention has been made in view of the foregoing disadvantages of the prior art.

Accordingly, it is an object of the present invention to provide an electronic component cooling apparatus which is capable of assembling a cooling unit separately from a holder mounting member.

It is another object of the present invention to provide an electronic component cooling apparatus which is capable of facilitating mounting and replacement of a holder mounting member.

It is a further object of the present invention to provide an electronic component cooling apparatus which is capable of enhanced tightness between a heat sink and an electronic component.

It is still another object of the present invention to provide an electronic component cooling apparatus which is capable of facilitating positioning of a holder mounting member.

It is yet another object of the present invention to provide an electronic component cooling apparatus which is capable of varying a positional relationship between a holder mounting member and a cooling unit as desired.

It is a still further object of the present invention to provide an electronic component cooling apparatus which is capable of attaining rigid fixing of an electronic component holder.

In accordance with the present invention, an electronic component cooling apparatus is provided. The apparatus includes a cooling unit including a heat sink and a motor-driven fan. The heat sink includes a base and a plurality of radiation fins provided on one surface of the base and the motor-driven fan includes a casing and is fixed with respect to the heat sink to feed cooling air to the radiation fins. The apparatus also includes an electronic component holder arranged for holding an electronic component thereon and provided with at least two holder-side engaged sections or projections and a holder mounting member for mounting the electronic component holder on the cooling unit while contacting the electronic component with the other surface of the base of the heat sink. The holder mounting member includes a unit engagement segment provided with a unit-side engagement section engaged with a part of the cooling unit and at least two holder engagement segments each provided with holder-side engagement sections releasably engaged with the projections of the electronic component holder.

In the present invention generally constructed as described above, the casing of the motor-driven fan is provided with a unit-side engaged section, which is releasably engaged with the unit-side engagement section of the unit engagement segment of the holder mounting member.

In a preferred embodiment of the present invention, the unit engagement segment is provided with at least one positioning engagement section and the cylindrical section of the casing is formed on an outer surface thereof with at least one positioning engaged section engaged with the positioning engagement section of the unit engagement segment.

In a preferred embodiment of the present invention, the unit engagement segment of the holder mounting member includes an annular member fitted on the cylindrical section of the casing to constitute the unit-side engagement section. The annular member of the unit engagement segment is formed on an inner periphery thereof with a positioning engagement section.

In a preferred embodiment of the present invention, the unit engagement segment includes at least two connection sections for connecting the annular member and the holder engagement segments to each other. The annular member includes a first part connected to the connection sections and a second part abutted against the flange section of the casing. The connection sections and the first part of the annular member are deformed about the second part of the annular member to generate elastic force sufficient to displace the holder engagement segments toward the cooling unit from the electronic component holder and force the second part of the annular member against the flange section.

In a preferred embodiment of the present invention, the holder engagement segments are formed so as to extend toward the electronic component holder from the connection sections, respectively. The holder-side engagement sections of the holder engagement segments and the projections of the electronic component holder are engaged with each other by snap-in fitting.

BRIEF DESCRIPTION OF THE DRAWINGS

These and other objects and many of the attendant advantages of the present invention will be readily appreciated as the same becomes better understood by reference to the following detailed description when considered in connection with the accompanying drawings; wherein.

DETAILED DESCRIPTION OF THE PREFERRED EMBODIMENT

Now, an electronic component cooling apparatus according to the present invention will be described hereinafter with reference to FIGS. 1A to 2D.

Figure 1A:
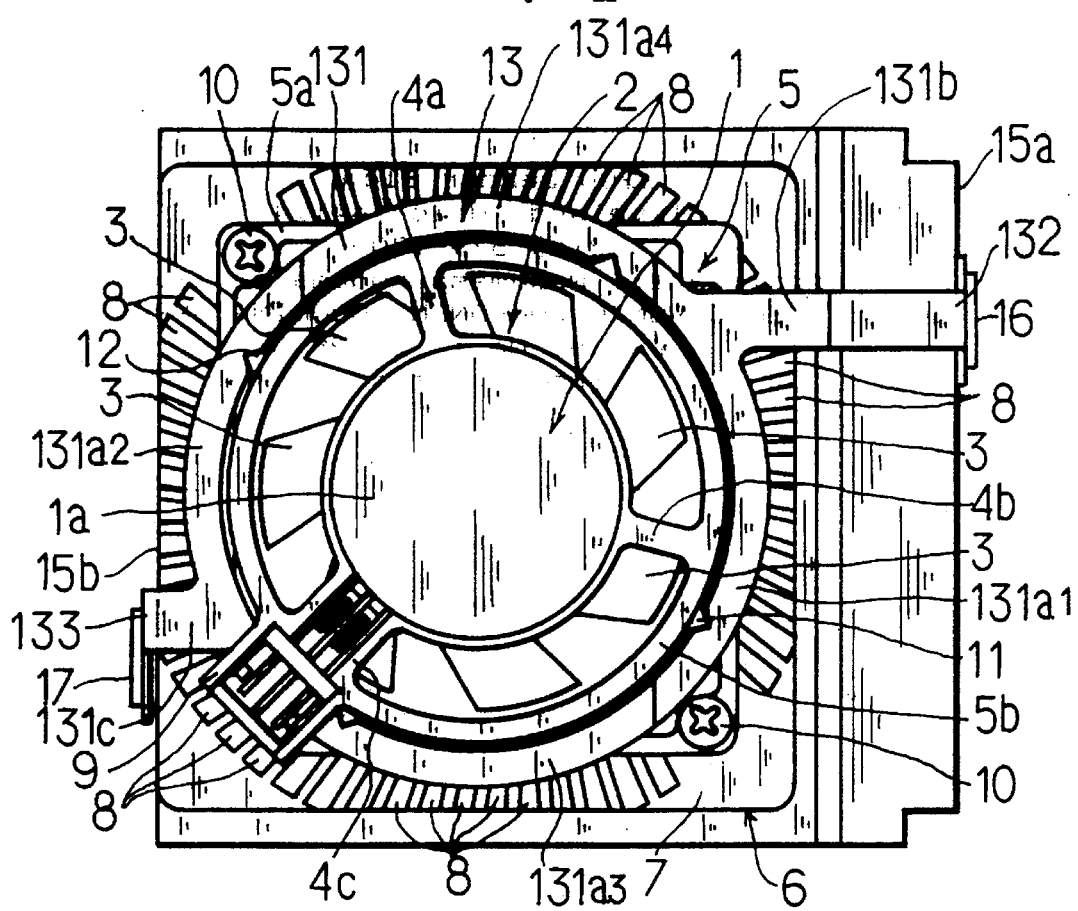
FIG. 1A is a front elevation view showing an embodiment of an electronic component cooling apparatus according to the present invention.
Figure 1B:
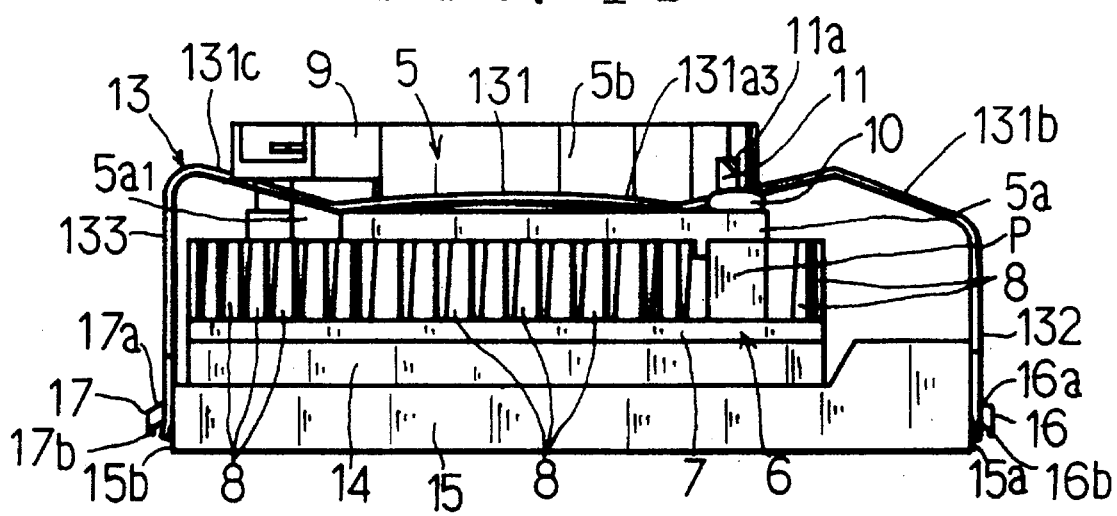
FIG. 1B is a side elevation view of the electronic component cooling apparatus shown in FIG. 1A.
Figure 2A:
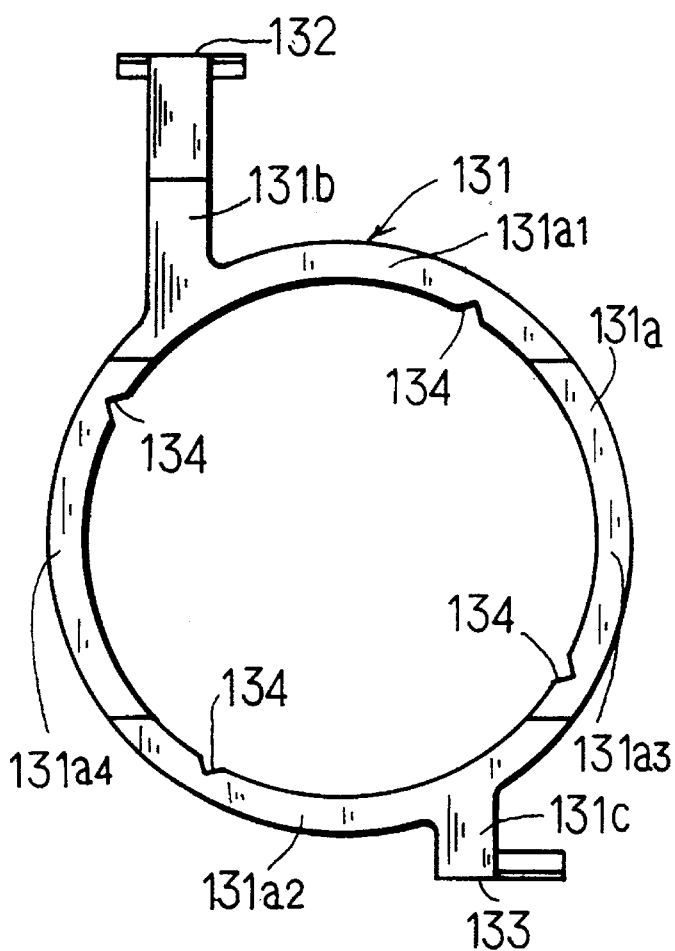
FIG. 2A is a plan view showing a holder mounting member.
Figure 2B:
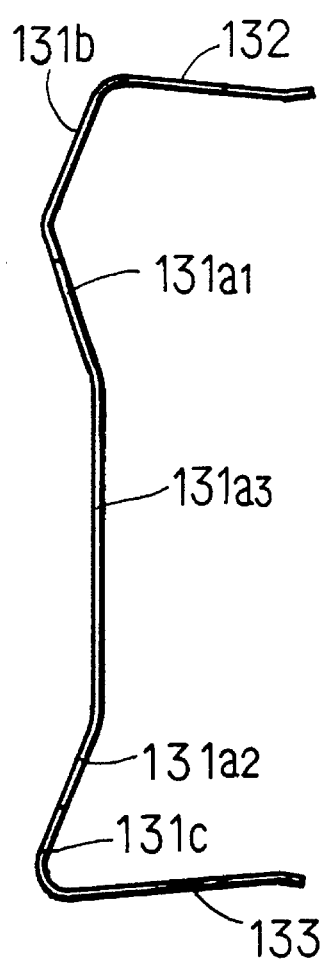
FIG. 2B is a front elevation view of the holder mounting member shown in FIG. 2A.
Figure 2C:
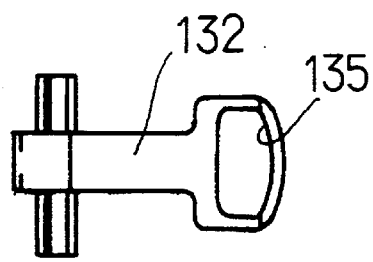
FIG. 2C is a front elevation view showing one holder engagement segment of the holder mounting member of FIG. 2A.
Figure 2D:
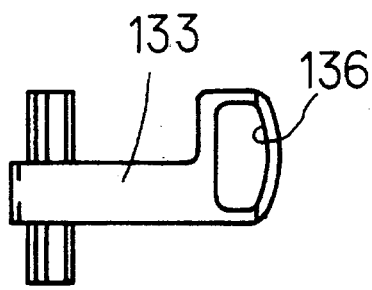
FIG. 2D is a front elevation view showing the other holder engagement segment of the holder mounting member of FIG. 2A.
Figure 3A:
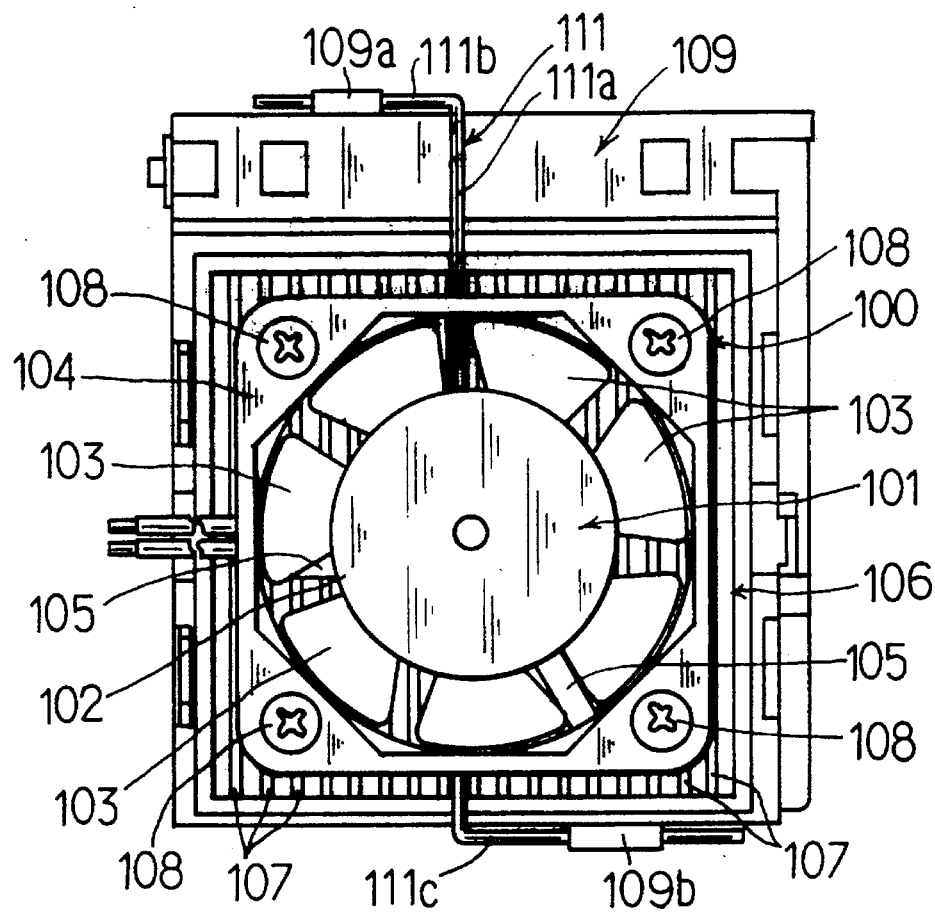
FIG. 3A is a front elevation view showing a conventional electronic component cooling apparatus.
Figure 3B:
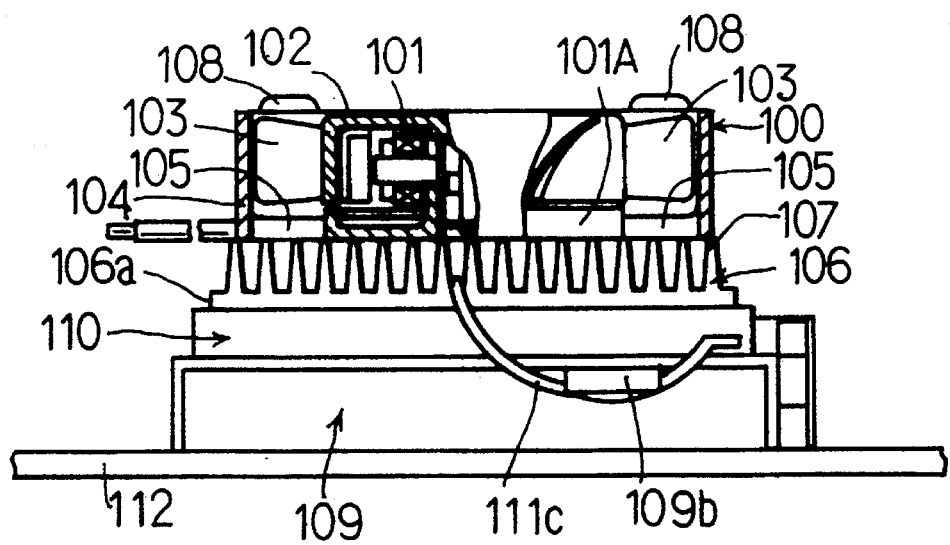
FIG. 3B is a partly cutaway side elevation view showing an essential part of the conventional electronic component cooling apparatus of FIG. 3A.

Referring first to FIGS. 1A and 1B, an embodiment of an electronic component cooling apparatus according to the present invention is illustrated. In FIGS. 1A and 1B, reference numeral 1 designates a brushless DC motor of the rotor out-rotation type wherein a rotor is rotated outside a stator. 2 is an impeller including a cup-like member of which a peripheral surface is fixedly mounted thereon with seven blades 3. The impeller 2 is integrally formed of a synthetic resin material such as polybutylene terephthalate or the like. In the illustrated embodiment, a two-phase brushless DC motor is used as the motor 1. The stator of the motor 1 includes an iron core (not shown) and an exciting coil (not shown) wound on the core. The stator is fixed on a boss arranged at a central portion of a housing 1a made of synthetic resin. The housing 1a is also fixedly mounted with a circuit board on which an electronic component constituting a part of a driving circuit is mounted. The rotor includes a revolving shaft supported in a bearing fixed on the housing 1a and a plurality of magnetic poles each comprising a permanent magnet and mounted on an inner peripheral surface of the cup-like member.

The housing 1a of the motor 1 is connected through three webs 4a to 4c to a casing 5 formed into an outer configuration of a rectangular or square shape. In the illustrated embodiment, the housing 1a, webs 4a to 4c and casing 5 are integrally formed of synthetic resin such as polybutylene terephthalate or the like. The webs 4a to 4c are arranged at angular intervals of about 120 degrees and the web 4c is constructed so as to guide a terminal. The casing 5 includes a flange section 5a constituting a base portion of the casing 5 contacted with a plurality of radiation fins 8 provided on one surface of a base 7 of a heat sink 6 described hereinafter and a cylindrical section 5b connected at one end thereof to the flange section 5a to surround a part of the impeller 2. The flange section 5a of the casing 5 is formed with a cutout 5a1 at a portion of a corner thereof positioned under a connector section 9 provided on the cylindrical section 5b. Also, the flange section 5a are at a pair of other corners thereof diagonally opposite to each with through-holes (not shown) in which mounting screws 10 are threadedly inserted. The casing 5 is formed so as to cover about three fourth of a vertical length or height of the blades 3 of the impeller 2, so that about one fourth of each of the blades 3 upwardly projects from the casing 5. Thus, the cylindrical section 5b constitutes a large part of an air duct of the impeller 2. Such construction of the illustrated embodiment permits the radiation fins 8 provided at the heat sink 6 to be extended to a lower end of the blades 3, to thereby enhance cooling efficiency, although it causes an increase in thickness of the cooling unit as in the prior art.

The connector section 9 integrally provided at the cylindrical section 5b of the casing 5 opposite to the heat sink 6 is constructed into a male connector structure. The connector section 9 includes positive and negative terminals for power feed and a signal output terminal through which a signal indicating interruption of the motor is sent. Arrangement of the connector section 9 at the cylindrical section 5b prevents excessive projection of the connector section 9 from the base portion. Also, arrangement of the connector section 9 not only permits the electronic component cooling apparatus of the illustrated embodiment to be mounted on an electronic appliance without caring about any wiring cord, but facilitates replacement of the electronic component cooling apparatus, for example, when it breaks down. Further, arrangement of the connector section 9 at the corner of the casing 5 free of any screws prevents the connector section 9 from interfering with access to screws on the casing.

The cylindrical section 5b of the casing 5 is integrally provided on an outer periphery thereof with two projections 11 and 12 at an angular interval of 180 degrees so as to act as a positioning engagement sections. The projections 11 and 12 each are provided with a portion 11a tapered toward the flange section 5a of the casing 5. Formation of the tapered portion 11a at each of the projections 11 and 12 facilitates mounting of a holder mounting member 13 described hereinafter. The projections 11 and 12 function to position the holder mounting member 13 and prevent rotation of the member 13. In the illustrated embodiment, two such projections 11 and 12 are provided. However, at least one such projection is merely required in the present invention.

The blades 3 of the impeller 2 are constructed so as to suck air from a side of the webs 4a to 4c and then forcibly flow it through the passage defined between each adjacent two of the radiation fins 8 mounted on the base 7 of the heat sink 6. Such construction effectively prevents flowing of air from being substantially interfered with on the suction side, to thereby improve ventilation efficiency, leading to an increase in cooling performance of the apparatus. Also, air flow in such a way prevents the motor from being exposed to air heated by the heat sink to restrain an excessive increase in a temperature in the motor, to thereby prevent durability of the motor from being deteriorated.

The motor-driven fan incorporated in the electronic component cooling apparatus of the illustrated embodiment may be arranged so as to blow air against the heat sink. Alternatively, it may be arranged so as to introduce air from a side of the heat sink. A motor for the motor-driven fan is not limited to any specific type. A DC motor such as a brushless DC motor or the like may be used for this purpose. Alternatively, an induction motor or the like may be conveniently used.

Now, a structure of the heat sink 6 will be described hereinafter.

In the illustrated embodiment, the heat sink 6 may be integrally formed of metal of increased thermal conductivity such as aluminum or the like. The base 7 is formed into an outer configuration of a substantially square shape and provided at each of a pair of corners thereof diagonally opposite to each other with a pillar P in a manner to be integral with the base. The radiation fins 8 are preferably arranged on the base 7 so as to externally guide air flowing out of the impeller 2 being rotated. The radiation fins 8 each include a first section (not shown) formed opposite to an end of the blades 3 defined on the side of the base 7 and a second portion (not shown) positioned on an outer side of the blades 3 defined in a radial direction thereof. Arrangement of the first portion in a manner to be opposite to the end of the blades 3 permits the radiation fins 8 to form, at a central portion thereof, a recess for partially receive the impeller 2. The radiation fins 8 each are formed into a wedge-like shape so that side surfaces thereof may intersect each other when they are inwardly extended beyond an inner end of the radiation fin. Thus, the radiation fins 8 each are formed so as to be gradually reduced in thickness toward the inner end, so that an air passage of a sufficient size may be formed between each adjacent two of the radiation fins 8. Also, the illustrated embodiment is constructed so as to reduce the number of parts to be screwed, to thereby facilitate assembling of the apparatus. In addition, arrangement of the pillars in one pair permits all the radiation fins other than those positioned at the pillars to be outwardly extended to an end of the base, to thereby increase an area on which heat radiation is carried out.

In the illustrated embodiment, the radiation fins 8 are radially arranged. Alternatively, they may be arranged in any other suitable configuration or manner.

The base 7 of the heat sink 6 is mounted on a rear surface thereof with an electronic component holder 15 for holding thereon an electronic component 14 such as an MPU or the like which exhibits high heat release. The mounting is carried out by means of the holder mounting member 13 briefly described above. The electronic component holder 15 holds the electronic component 14 in a manner to keep the component 14 contacted with the rear surface of the base 7. To this end, the electronic component holder 15 may comprise a socket which is commercially available under a product number NP11-273K13221 from Yamaichi Denki Kabushiki Kaisha, a Japanese corporation. The electronic component holder 15 is integrally formed on end surfaces 15a and 15b thereof opposite to each other with projections 16 and 17, respectively, each of which constitutes a holder-side engaged section. The projections 16 and 17 have upper surfaces 16a and 17a formed so as to obliquely downwardly extend in an outward direction, respectively. Also, the projections 16 and 17 have lower surfaces formed at an outer end thereof with downwardly extending projections 16b and 17b, respectively, Thus, it will be noted that the projections 16 and 17 each are formed into a hook-like shape. The above-described slope of each of the upper surfaces 16a and 17a functions to permit holder engagement segments 132 and 133 of the holder mounting member 13 described hereinafter to be be readily forcedly expanded in an outward direction.

The holder mounting member 13, as shown in FIGS. 2A to 2D, includes a unit engagement segment 131 provided with a unit-side engagement section engaged with a part of the cooling unit and two holder engagement segments 132 and 133 each provided with a holder-side engagement section. The holder-side engagement sections comprise holes releasably engaged with the projections 16 and 17 constituting the holder-side engaged sections of the electronic component holder 15. The holder mounting member 13 may be integrally formed by machining a steel sheet of a thickness in 0.6 mm made of stainless steel such as SUS 304 CSP 1/2H. This permits the holder mounting member 13 to be increased in mechanical strength and decreased in manufacturing cost.

The unit engagement segment 131 of the holder mounting member 13 includes an annular member 131a which provides a unit-side engagement section fitted on the cylindrical section 5b of the casing 5 and engaged with the flange section 5a of the casing 5 and two connection sections 131b and 131c for connecting the annular member 131a to the holder engagement segments 132 and 133. The annular member 131a of the unit engagement segment 131 is formed on an inner peripheral surface thereof with four recesses 134 at angular intervals of 90 degrees, which recesses 134 each constitute a positioning engagement section in a peripheral direction thereof. The recesses 134 each are formed into a shape corresponding to the projections 11 and 12 provided on the cylindrical section 5b of the casing 5, so that positioning of the unit engagement segment 131 of the holder mounting member 13 and prevention of rotation of the unit engagement segment 131 may be accomplished. Also, this facilitates mounting and position of the holder mounting member 13 with respect to the casing 5.

In general, the cylindrical section 5b of the casing 5 is preferably provided on an outer surface thereof with the positioning engagement sections or projections 11 and 12 of n in number (n: integer of 2 or more) at angular intervals of 360/n degrees. Such arrangement of the projections 11 and 12 permits the annular member 131a of the unit engagement segment 131 to be tightly fitted in the cylindrical section 5b of the casing 5. Also, the annular member 131a of the unit engagement segment 131 may be provided on an inner peripheral surface thereof with a plurality of the recesses 134 at angular intervals of 360/2n degrees in the peripheral direction thereof, so that a position at which the holder mounting member 131 is mounted on the casing 5 and a manner of the mounting may be varied as desired. In particular, this, when the heat sink 6 is formed into an outer configuration of a square shape, permits a position at which the cord is drawn out and a position of the connector sections 9 to be varied as desired by rotation of the cooling unit.

The two connection sections 131b and 131c are located at positions spaced by an angle of 180 degrees from each other in a circumferential direction of the unit engagement segment 131 and arranged so as to extend in a direction perpendicular to sides of the flange section 5a of the casing 5 corresponding thereto. The connection section 131b is formed into a substantially convex shape in section as shown in FIG. 1B and the connection section 131c is formed so as to obliquely extend from the annular member 131a while being away from the flange section 5a. The annular section 131 includes a first arcuate portion 131a1 to which the connection section 131b is connected and a second arcuate section 131a2 to which the connection section 131c is connected, as well as third and fourth arcuate sections 131a3 and 131a4 adapted to be abutted against the flange section 5a of the casing 5. The first arcuate portion 131a1 and second arcuate portion 131a2 are bent in a direction away from the flange section 5a. Such formation and arrangement of the connection sections 131b and 131c and the first and second arcuate portions 131a1 and 131a2 of the annular member 131a cause the annular member 131a to deformed about the third and fourth arcuate portions 131a3 and 131a4 abutted against the flange section 5a of the casing 5 while keeping the holder engagement segments 132 and 133 stretched toward the electronic component holder 15, resulting in generating elastic force which is sufficient to or acts to deform the holder engagement segments 132 and 133 toward the cooling unit from the electronic component holder 15 and forcibly press the third and fourth arcuate portions 131a3 and 131a4 against the flange section 5a of the casing 5. Generation of such elastic force utilizing a part of the annular member 131a permits a magnitude of the elastic force to be significantly increased. Also, the elastic force due to the unit engagement segment 131 enhances tightness between the seat sink 6 and the electronic component 14. Further, the elastic force contributes to firm engagement between the holder-side engagement sections or projections 135 and 136 of the holder engagement segments 132 and 133 and the holder-side engaged sections 16 and 17 of the electronic component holder 15.

The holder engagement segments 132 and 133 are formed so as to extend to the electronic component holder 15 and provided at an end thereof with the engagement holes or holder-side engagement sections 135 and 136 in which the projections 16 and 17 provided on the outer surface of the casing 5 are engagedly fitted, respectively. Mounting of the holder mounting member 13 on the casing 5 is carried out by first moving a distal end of each of the holder engagement segments 132 and 133 along each of the slanting upper surfaces 16a and 17a of the projections 16 and 17, to thereby cause the holder engagement segments 132 and 133 to outwardly extend. Then, the holder mounting member 13 is further forced to engagedly fit the holes 135 and 136 of the holder engagement segments 132 and 133 on the projections 16 and 17, to thereby return each of the holder engagement segments 132 and 133 to its original state. This leads to snap-in engagement which permits mounting of the holder mounting member 13 by one-touch operation. The term "snap-in engagement" used herein indicates that the holder engagement segments 132 and 133 are abutted against a part of the projections 16 and 17 during movement of the holder mounting member 13 toward the electronic component holder 15, resulting in being deformed, followed by engagement between the holder-side engagement sections 135 and 136 and the projections 16 and 17 of the electronic component holder 15, leading to cancellation of the deformation, so that the engagement may be held.

In the illustrated embodiment, the holder engagement segments 132 and 133 each are outwardly slightly bent at the distal end thereof, to thereby be permitted to be outwardly extended. An increase in elastic force of the unit engagement segment 131 described above ensures firm engagement between the holes or holder-side engagement 135 and 136 and the holder-side engaged sections or projections 16 and 17 of the electronic component holder 15.

The illustrated embodiment is so constructed that rotation of the cooling unit comprising the heat sink 6 and motor-driven fan permits four positions to be selectively determined for the connector section 9. An increase in the number of recesses 134 permits the number of positions selected for the connector section 9 to be increased to five or more.

Mounting of the electronic component holder 15 by means of the holder mounting member 13 is carried out by inserting the connector section 9 through the annular section 131 of the holder mounting member 13 to fit the annular section 131 on the cylindrical section 5b of the casing 5. Then, the projections 11 and 12 are fitted in the recesses 134 of the holder mounting member 13. Thereafter, the electronic component holder 15 is positioned on the bottom surface of the heat sink 6 while keeping the electronic part 14 contacted with the rear surface or bottom surface of the heat sink 6. Subsequently, the connection sections 131b and 131c are pressed toward the electronic component holder 15 to deform the unit engagement segment 131, so that the holes 135 and 136 of the holder engagement segments 132 and 133 may be engagedly fitted on the projections 16 and 17 of the electronic component holder 15. Alternatively, the holder mounting member 13 may be previously fitted on the cylindrical section 5b of the casing 5 unless the transportation is inconvenient.

The unit-side engagement section 131a and unit-side engaged section 5a may be constructed in any desired manner so long as they permit the unit engagement segment 131 of the holder mounting member 13 to be firmly engaged with the casing 5. For example, the cylindrical section 5b of the casing 5 may be provided on the outer surface thereof with a projection means which serves as the unit-side engaged section. Alternatively, the unit-side engaged section may comprise an end of an opening of the cylindrical section 5b of the casing 5. In this regard, the unit-side engagement section of the unit engagement segment 131 of the holder mounting member 13 may be constructed so as to be engaged with the end of the opening of the cylindrical section 5b of the casing 5.

The illustrated embodiment, as described above, is so constructed that the electronic component holder 15 is provided with the projections 16 and 17 acting as the holder-side engaged section and the holder engagement segments 132 and 133 are provided with the holes 135 and 136 acting as the holder-side engagement section. Alternatively, the electronic component holder 15 is provided on both end surfaces 15a and 15b thereof with recesses and the holder engagement segments 132 and 133 are provided with projections to be engaged with the recesses.

Also, in the illustrated embodiment, the positioning engagement section provided on the annular member 131a of the unit engagement segment 131 of the holder mounting member 13 comprises the recesses 134, whereas the positioning engaged section provided on the casing 5 comprises the projections 11 and 12. Conversely, the annular member 131a of the unit engagement segment 131 may be provided thereon with projections, whereas the cylindrical section 5b of the casing 5 may be provided with recesses to be engaged with the projections.

Further, in the illustrated embodiment, two such holder engagement segments are arranged in correspondence to two of the sides of the electronic component holder 15. Additional holder engagement segments may be arranged with respect to the remaining two sides of the holder 15.

As can be seen from the foregoing, the electronic component cooling apparatus of the present invention may be so constructed that the unit-side engaged section engaged with the unit-side engagement section of the unit engagement segment of the holder mounting member is provided on the casing of the motor-driven fan and engagement between the unit-side engagement section of the unit engagement segment and the unit-side engaged section of the casing is releasably carried out. Such construction permits the cooling unit to be assembled independently from the holder mounting member, to thereby prevent the holder mounting member from interfering with assembling of the cooling unit and electronic component holder. Also, when any failure or trouble occurs in the holder mounting member during assembling of the cooling apparatus, it permits replacement of the holder mounting member without detaching the motor-driven fan from the heat sink, so that the replacement is facilitated.

Also, the present invention permits the annular member of the holder mounting member to be forcedly pressed against the flange section of the casing of the motor-driven fan, leading to an increase in tightness between the heat sink and the electronic component.

Further, the present invention accomplishes ready mounting of the holder mounting member by snap-in fitting.

While a preferred embodiment of the invention has been described with a certain degree of particularity with reference to the drawings, obvious modifications and variations are possible in light of the above teachings. It is therefore to be understood that within the scope of the appended claims, the invention may be practiced otherwise than as specifically described.

What is claimed is:

1. An electronic component cooling apparatus comprising:
   a cooling unit including a heat sink and a motor-driven fan having an impeller;
   said heat sink including a base and a plurality of radiation fins provided on one surface of said base;
   said motor-driven fan including a casing and being fixed with respect to said heat sink to feed cooling air to said radiation fins;
   an electronic component holder arranged for holding an electronic component thereon and provided with at least two holder-side engaged sections; and
   a holder mounting member for mounting said electronic component holder on said cooling unit while contacting said electronic component with the other surface of said base of said heat sink;
   said holder mounting member including a unit engagement segment provided with a unit-side engagement section engaged with a part of said cooling unit and at least two holder engagement segments each provided with holder-side engagement sections releasably engaged with said holder-side engaged sections of said electronic component holder;
   said casing of said motor-driven fan being provided with a unit-side engaged section engaged with said unit-side engagement section of said holder mounting member;
   said unit-side engagement section of said unit engagement segment and said unit-side engaged section of said casing being releasably engaged with each other;
   said casing of said motor-driven fan including a cylindrical section arranged so as to surround at least a part of said impeller and a flange section arranged at one end of said cylindrical section so as to constitute said unit-side engaged section;
   said unit engagement segment being provided with at least one positioning engagement section;
   said cylindrical section of said casing being formed on an outer surface thereof with at least one positioning engaged section engaged with said positioning engagement section of said unit engagement segment.

2. An electronic component cooling apparatus as defined in claim 1, wherein said unit engagement segment of said holder mounting member includes an annular member fitted on said cylindrical section of said casing to constitute said unit-side engagement section;
   said positioning engagement section of said unit engagement segment being formed on an inner peripheral surface of said annular member.

3. An electronic component cooling apparatus as defined in claim 2, wherein the number of said positioning engaged sections provided on said outer surface of said cylindrical section of said casing is n (n: integer of 2 or more) and said positioning engaged sections are arranged at angular intervals of 360/n degrees in a circumferential direction of said cylindrical section.

4. An electronic component cooling apparatus as defined in claim 3, wherein said heat sink is formed into an outer configuration of a substantially square shape;
   said annular member of said unit engagement segment being provided on said inner peripheral surface thereof with a plurality of said positioning engagement sections at angular intervals of 360/2n degrees in a peripheral direction thereof.

5. An electronic component cooling apparatus as defined in claim 1, wherein said unit engagement segment includes at least two connection sections for connecting said annular member and said holder engagement segments to each other;

said annular member including a first part connected to said connection sections and a second part abutted against said flange section of said casing;

said connection sections and said first part of said annular member being deformed about said second part of said annular member to generate elastic force sufficient to displace said holder engagement segments toward said cooling unit from said electronic component holder.

6. An electronic component cooling apparatus as defined in claim 5, wherein said holder engagement segments are formed so as to extend toward said electronic component holder from said connection sections, respectively;

said holder-side engagement sections of said holder engagement segments and said holder-side engaged sections of said electronic component holder being engaged with each other by snap-in fitting.

7. An electronic component cooling apparatus comprising:

a cooling unit including a motor-driven fan and a heat sink;

said motor-driven fan including a motor including a rotor, a stator and a housing, an impeller including a plurality of blades and fixed on said rotor, a casing including a cylindrical section for surrounding a part of said impeller and a flange section positioned at one end of said cylindrical section, and a plurality of webs for interconnecting said housing of said motor and said casing;

said heat sink including a base and a plurality of radiation fins provided on one surface of said base and being fixed on said flange section of said casing;

an electronic component holder of a polygonal shape provided on at least a pair of end surfaces thereof opposite to each other with holder-side engaged sections and arranged so as to hold an electronic component thereon; and a holder mounting member for releasably mounting said electronic component holder on said cooling unit while contacting said electronic component with the other surface of said base of said heat sink;

said holder mounting member including a unit engagement segment provided with a unit-side engagement section engaged with a part of said cooling unit and at least two holder engagement segments each provided with a holder-side engagement section releasably engaged with said holder-side engaged sections of said electronic component holder;

said flange section of said casing constituting a unit-side engaged section with which said unit-side engagement section of said unit engagement segment is engaged;

said cylindrical section of said casing being formed on an outer surface thereof with a positioning engaged section engaged with a positioning engagement section of said unit engagement segment;

said unit engagement segment of said holder mounting member including an annular member fitted on said cylindrical section of said casing and engaged with said flange section of said casing to constitute said unit-side engagement section;

said positioning engagement section of said unit engagement segment being formed on an inner periphery of said annular member.

8. An electronic component cooling apparatus as defined in claim 7, wherein said cylindrical section of said casing is formed into a circular shape in section;

said heat sink is formed into an outer configuration of a substantially square shape;

said cylindrical section of said casing is provided on an outer surface thereof with two said positioning engaged sections in a manner to be spaced at an angular interval of 180 degrees in a peripheral direction thereof; and said annular member of said unit engagement segment of said holder mounting member is provided on said inner periphery thereof with four said positioning engagement sections at angular intervals of 90 degrees in a peripheral direction thereof.

9. An electronic component cooling apparatus as defined in claim 8, wherein said holder engagement segments are two in number;

said unit engagement segment includes two connection sections for connecting said annular member and said two holder engagement segments to each other;

said annular member includes arcuate portions connected to said connection sections and abutted portions abutted against said flange section of said casing; and said connection sections and said arcuate portions of said annular member are deformed about said abutted portions to generate elastic force sufficient to displace said holder engagement segments toward said cooling unit from said electronic component holder and force said abutted portions against said flange section.

10. An electronic component cooling apparatus comprising:

a cooling unit including a motor-driven fan and a heat sink formed into a substantially rectangular shape;

said motor-driven fan including a motor of the rotor out-rotation type including a stator, a rotor rotated outside said stator and a housing, an impeller including a plurality of blades and fixed on said rotor, a casing including a cylindrical section parranged for surrounding a part of said impeller and a flange section of a polygonal shape arranged at one end of said cylindrical section including at least three corners, and a plurality of webs for interconnecting said housing of said motor and said casing;

said heat sink including a base and a plurality of radiation fins provided on one surface of said base and being fixed on said flange section of said casing;

an electronic component holder of a substantially rectangular shape provided on a pair of end surfaces thereof opposite to each other with holder-side engaged sections and arranged so as to hold an electronic component thereon, said holder-side engaged sections each comprising a projection; and a holder mounting member for releasably mounting said electronic component holder on said cooling unit while contacting said electronic component with the other surface of said base of said heat sink;

said holder mounting member including a unit engagement segment provided with a unit-side engagement section engaged with a part of said cooling unit and two holder engagement segments respectively provided with holder-side engagement sections releasably engaged with said holder-side engaged sections of said electronic component holder, said holder-side engagement sections each comprising a hole or a recess;

said flange section of said casing constituting a unit-side engaged section with which said unit-side engagement section of said unit engagement segment is engaged;

said cylindrical section of said casing being formed on an outer surface thereof with two positioning engaged sections;

said unit engagement segment of said holder mounting member including an annular member fitted on said cylindrical section of said casing and engaged with said flange section of said casing to constitute said unit-side engagement section;

said annular member of said unit engagement segment being formed on an inner periphery thereof with at least two positioning engagement sections engaged with said positioning engaged sections provided on said casing.

11. An electronic component cooling apparatus as defined in claim 10, wherein said positioning engaged sections provided on said outer surface of said cylindrical section of said casing are arranged at an angular interval of 180 degrees in a peripheral direction thereof.

12. An electronic component cooling apparatus as defined in claim 11, wherein said heat sink is formed into an outer configuration of a substantially square shape;

said annular member of said unit engagement segment is provided on said inner periphery thereof with four said positioning engagement sections at angular intervals of 90 degrees in said peripheral direction.

13. An electronic component cooling-apparatus as defined in claim 10, wherein said unit engagement segment includes two connection sections extending between said annular member and said holder engagement segments;

said connection sections are arranged at an angular interval of 180 degrees and so as to extend in a direction perpendicular to sides of said flange section corresponding thereto;

said annular members includes arcuate portions connected to said connection sections and abutted portions abutted against said flange section of said casing; and said connection sections and said arcuate portions of said annular member are deformed about said abutted portions to generate elastic force sufficient to displace said holder engagement segments toward said cooling unit from said electronic component holder.

14. An electronic component cooling apparatus as defined in claim 10, wherein said radiation fins are arranged on said base so as to surround a part of said impeller;

said blades of said impeller being arranged so as to suck air from a side of said webs and flow it toward said radiation fins;

said radiation fins being arranged so as to outwardly guide an air stream fed from said impeller rotating through a flow passage defined between each adjacent two of said radiation fins.

15. An electronic component cooling apparatus as defined in claim 10, wherein said base of said heat sink is formed into an outer configuration of a substantially square shape;

said base is provided at each of corners thereof diagonally opposite to each other with a pillar in a manner to be integral therewith; and said casing is screwed to said pillars.

16. An electronic component cooling apparatus as defined in claim 10, wherein said base of said heat sink is formed into a size larger than said flange section of said casing; and said motor-driven fan is arranged so as to permit said radiation fins to be partially exposed from a circumference of said flange section.

17. An electronic component cooling apparatus as defined in claim 10, wherein said casing is provided with a connector section including a plurality of terminals through which a power required for driving said motor is input.

18. An electronic component cooling apparatus as defined in claim 10, wherein said base is integrally provided on each of a pair of corners thereof diagonally opposite to each other with a pillar;

said casing is screwed on said pillars; and said connector section is arranged at any corner of said base other than said corners provided with said pillars.

19. An electronic component cooling apparatus as defined in claim 18, wherein said connector section is arranged at said cylindrical section.

* * * * *

UNITED STATES PATENT AND TRADEMARK OFFICE
CERTIFICATE OF CORRECTION

PATENT NO. : 5,519,574
DATED : May 21, 1996
INVENTOR(S) : Kodama et al.

It is certified that error appears in the above-identified patent and that said Letters Patent is hereby corrected as shown below:

Column 1, line 24, delete "astator" and insert --a stator--.

Column 5, line 32, delete "a" and insert --the--.

Column 7, line 67, delete "or pro-".

Column 8, line 1, delete "jections";
Column 8, line 2, after "sections" insert --or projections--

Column 12, line 38, delete "parranged" and insert --arranged--.

Signed and Sealed this

Eighth Day of October, 1996

Attest:

BRUCE LEHMAN

*Attesting Officer*     *Commissioner of Patents and Trademarks*